(12) United States Patent
Shim et al.

(10) Patent No.: US 11,532,634 B2
(45) Date of Patent: Dec. 20, 2022

(54) VERTICAL MEMORY DEVICE INCLUDING SUBSTRATE CONTROL CIRCUIT AND MEMORY SYSTEM INCLUDING THE SAME

(71) Applicant: Samsung Electronics Co., Ltd., Suwon-si (KR)

(72) Inventors: Sang-won Shim, Seoul (KR); Bong-soon Lim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 115 days.

(21) Appl. No.: 16/035,995

(22) Filed: Jul. 16, 2018

(65) Prior Publication Data

US 2019/0139968 A1    May 9, 2019

(30) Foreign Application Priority Data

Nov. 6, 2017  (KR) .................. 10-2017-0146793

(51) Int. Cl.
*H01L 27/115* (2017.01)
*G11C 16/24* (2006.01)
(Continued)

(52) U.S. Cl.
CPC ............ *H01L 27/115* (2013.01); *G11C 5/025* (2013.01); *G11C 5/146* (2013.01); *G11C 7/1051* (2013.01); *G11C 16/24* (2013.01); *G11C 16/30* (2013.01); *H01L 27/11526* (2013.01); *G11C 7/18* (2013.01); *G11C 8/14* (2013.01); *G11C 16/0483* (2013.01); *G11C 16/08* (2013.01)
(Continued)

(58) Field of Classification Search
CPC ............................................... H01L 27/11526
See application file for complete search history.

(56) References Cited

U.S. PATENT DOCUMENTS

| | | | |
|---|---|---|---|
| 8,933,502 B2 | 1/2015 | Higashitani et al. | |
| 9,117,526 B2 | 8/2015 | Lai | |

(Continued)

FOREIGN PATENT DOCUMENTS

| | | |
|---|---|---|
| JP | 2012-221540 A | 11/2012 |
| KR | 10-2016-0034519 A | 3/2016 |
| KR | 10-2016-0131458 A | 11/2016 |

OTHER PUBLICATIONS

Korean Office Action dated Jun. 20, 2022 issued in Korean Patent Application No. 10-2017-0146793.

*Primary Examiner* — Matthew E Warren
(74) *Attorney, Agent, or Firm* — Harness, Dickey & Pierce, P.L.C.

(57) ABSTRACT

A nonvolatile memory device comprises a first semiconductor layer including, an upper substrate, and a memory cell array in which a plurality of word lines on the upper substrate extend in a first direction and a plurality of bit lines extend in a second direction. The nonvolatile memory device comprises a second semiconductor layer under the first semiconductor layer in a third direction perpendicular to the first and second directions, the second semiconductor layer including, a lower substrate, and a substrate control circuit on the lower substrate and configured to output a bias voltage to the upper substrate. The second semiconductor layer is divided into first through fourth regions, each of the first through fourth regions having an identical area, and the substrate control circuit overlaps at least a portion of the first through fourth regions in the third direction.

20 Claims, 12 Drawing Sheets

(51) Int. Cl.
*G11C 7/10* (2006.01)
*G11C 5/14* (2006.01)
*G11C 16/30* (2006.01)
*G11C 5/02* (2006.01)
*H01L 27/11526* (2017.01)
*G11C 16/08* (2006.01)
*G11C 16/04* (2006.01)
*G11C 7/18* (2006.01)
*G11C 8/14* (2006.01)

(56) References Cited

U.S. PATENT DOCUMENTS

| | | |
|---|---|---|
| 9,397,111 B1 * | 7/2016 | Chowdhury ........ H01L 27/1157 |
| 9,431,415 B2 | 8/2016 | Shin et al. |
| 9,508,738 B2 | 11/2016 | Lee et al. |
| 9,515,087 B2 | 12/2016 | Son et al. |
| 9,653,562 B2 | 5/2017 | Kim et al. |
| 9,659,959 B2 | 5/2017 | Lee et al. |
| 2012/0263003 A1 * | 10/2012 | Sakakibara ....... G11C 11/40615 365/222 |
| 2013/0248975 A1 | 9/2013 | Hishida et al. |
| 2015/0263011 A1 | 9/2015 | Hong |
| 2016/0086967 A1 * | 3/2016 | Lee ...................... H01L 23/535 365/185.18 |
| 2016/0124810 A1 * | 5/2016 | Yang ...................... G11C 29/42 714/764 |
| 2016/0149004 A1 * | 5/2016 | Rabkin ............... H01L 27/1157 257/43 |
| 2017/0179026 A1 | 6/2017 | Toyama et al. |

* cited by examiner

FIG. 5
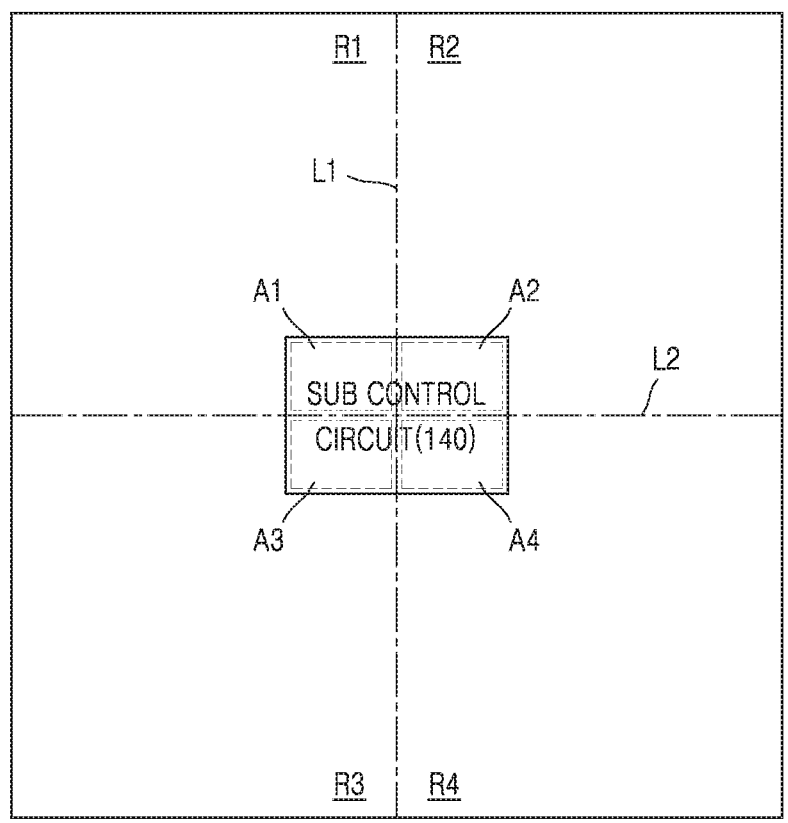
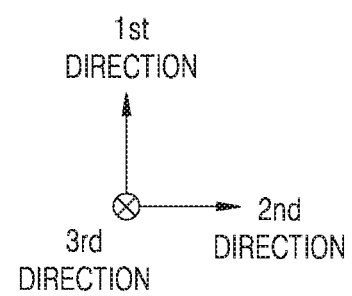

VERTICAL MEMORY DEVICE INCLUDING SUBSTRATE CONTROL CIRCUIT AND MEMORY SYSTEM INCLUDING THE SAME

CROSS-REFERENCE TO RELATED APPLICATION

This application claims the benefit of Korean Patent Application No. 10-2017-0146793, filed on Nov. 6, 2017, in the Korean Intellectual Property Office, the disclosure of which is incorporated herein in its entirety by reference.

BACKGROUND

Inventive concepts relate to a vertical memory device, and more particularly, to a vertical memory device including a substrate control circuit and a memory system including the same.

In recent years, as information communication devices have become more multi-functional, there has been a demand for larger capacity and higher integration of memory devices. As memory cell sizes of the memory devices for the higher integration are reduced, operating circuits and/or wiring structures included in the memory devices for an operation and electrical connection of the memory devices have become more complex. Accordingly, a memory device which has improved electrical characteristics while increasing a degree of integration thereof is desired.

SUMMARY

Inventive concepts provide a vertical memory device, and more particularly, a vertical memory device including a substrate control circuit.

According to some example embodiments of inventive concepts, there is provided a nonvolatile memory device comprising a first semiconductor layer including, an upper substrate, and a memory cell array in which a plurality of word lines on the upper substrate extend in a first direction and a plurality of bit lines extend in a second direction. The nonvolatile memory device comprises a second semiconductor layer under the first semiconductor layer in a third direction perpendicular to the first and second directions, the second semiconductor layer including, a lower substrate, and a substrate control circuit on the lower substrate and configured to output a bias voltage to the upper substrate. The second semiconductor layer is divided into first through fourth regions, each of the first through fourth regions having an identical area, and the substrate control circuit overlaps at least a portion of the first through fourth regions in the third direction.

According to some example embodiments of inventive concepts, there is provided a nonvolatile memory device comprising a first semiconductor layer including an upper substrate and a memory cell array stacked on the upper substrate in a stacking direction. The nonvolatile memory device further comprises a second semiconductor layer under the first semiconductor layer in the stacking direction, the second semiconductor layer including a lower substrate, a substrate contact plug between the lower substrate and the upper substrate, and a substrate control circuit on the lower substrate and configured to provide a bias voltage to the upper substrate through the substrate contact plug. The second semiconductor layer is divided into first through fourth regions having an identical area and, in the stacking direction, the substrate control circuit overlaps at least a portion of at least two regions among the first through fourth regions.

According to some example embodiments of inventive concepts, there is provided a nonvolatile memory device comprising a first semiconductor layer including a memory cell array in which a plurality of word lines extend in a first direction and a plurality of bit lines extend in a second direction, and an upper substrate under the memory cell array, the upper substrate supporting the memory cell array. The nonvolatile memory device further comprises a second semiconductor layer under the first semiconductor layer in a third direction perpendicular to the first and second directions, the second semiconductor layer including a lower substrate, a substrate control circuit on the lower substrate and configured to output a bias voltage to the upper substrate, and a plurality of substrate contact plugs electrically connecting the substrate control circuit to the upper substrate. The second semiconductor layer is divided by a first imaginary line in the first direction and a second imaginary line in the second direction which cross each other, and comprises at least a portion of first through fourth regions overlapping the memory cell array, and at least one of the plurality of substrate contact plugs is in the first through fourth regions.

BRIEF DESCRIPTION OF THE DRAWINGS

Embodiments of inventive concepts will be more clearly understood from the following detailed description taken in conjunction with the accompanying drawings in which:

FIG. 5 is a plan view illustrating a top surface of a second semiconductor layer in contact with a first semiconductor layer according to an example embodiment of inventive concepts;

DETAILED DESCRIPTION OF EXAMPLE EMBODIMENTS

Hereinafter, embodiments of inventive concepts will be described in detail with reference to the accompanying drawings.

Figure 1:
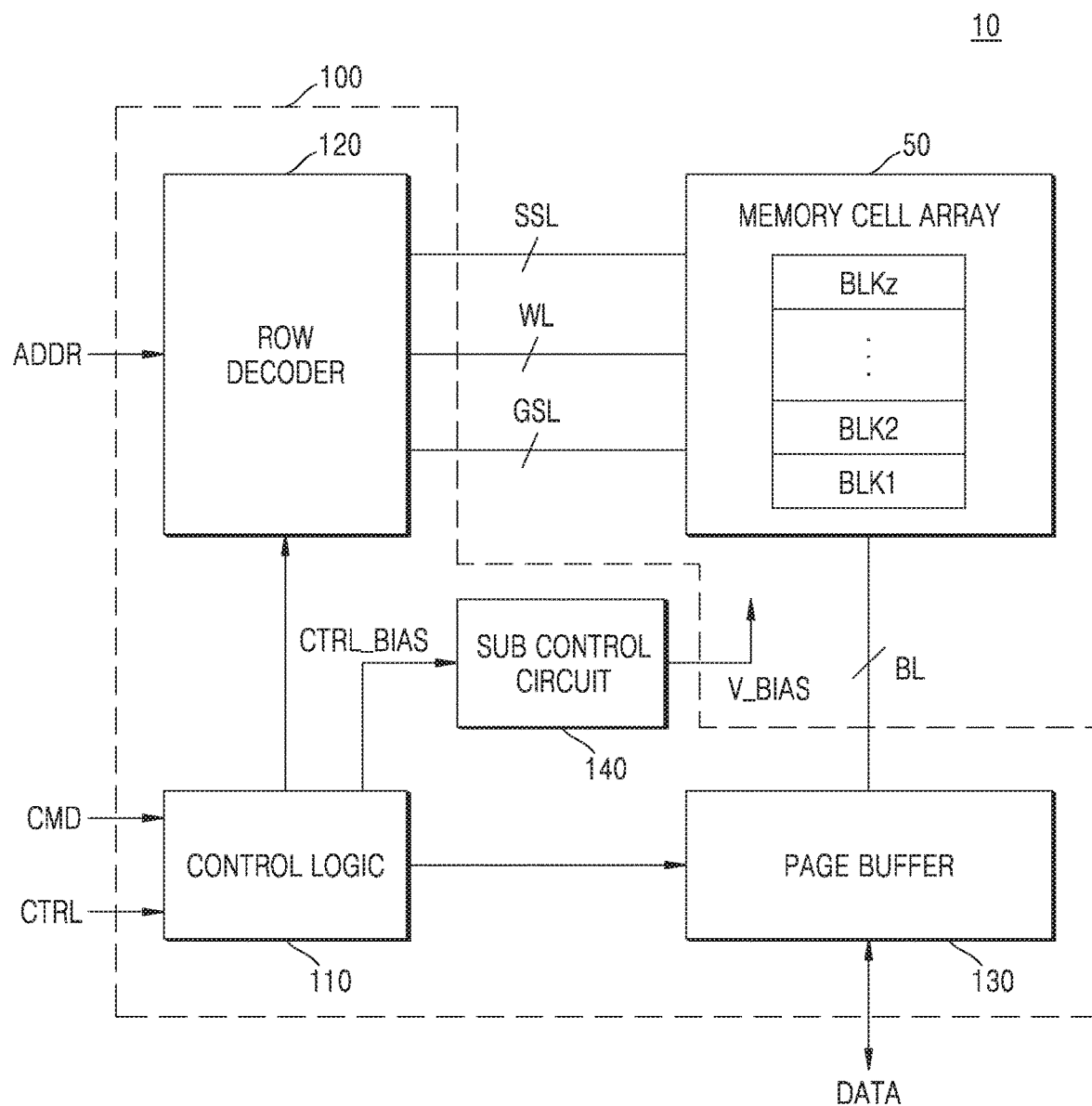
FIG. 1 is a block diagram illustrating a memory device according to an example embodiment of inventive concepts.

FIG. 1 is a block diagram illustrating a memory device 10 according to an example embodiment of inventive concepts.

Referring to FIG. 1, the memory device 10 may include a memory cell array 50 and a peripheral circuit 100. Although not shown, the memory device 10 may further include a data input/output circuit and/or an input/output interface.

The memory cell array 50 may include a plurality of memory cells and may be connected to string selection lines SSL, word lines WL, ground selection lines GSL, and bit lines BL. Particularly, the memory cell array 50 may be connected to a row decoder 120 through the string select lines SSL, the word lines WL, and the ground select lines GSL, and may be connected to a page buffer 130 through the bit lines BL.

For example, the plurality of memory cells included in the memory cell array 50 may be nonvolatile memory cells that maintain data stored therein even when supplied power is interrupted. Particularly, when a memory cell is a nonvolatile memory cell, the memory device 10 may be or may include electrically erasable programmable read-only memory (RAM) (EEPROM), a flash memory, phase change random access memory (RAM) (PRAM), resistance ROM (RRAM), a nano-floating gate memory (NFGM), polymer RAM (PoRAM), magnetic RAM (MRAM), or ferroelectric RAM (FRAM). Hereinafter, embodiments will be described by taking as an example a case where the plurality of memory cells are NAND flash memory cells, but it will be understood that inventive concepts are not limited thereto.

The memory cell array 50 may include a plurality of blocks BLK1 through BLKz, and each of the blocks BLK1 through BLKz may have a planar structure or a three-dimensional (3D) structure. The memory cell array 50 may include at least one of a single-level cell block including single-level cells (SLCs), a multi-level cell block including multi-level cells (MLCs), a triple-level cell block including triple-level cells (TLCs), and a quad-level cell block including quad-level cells (QLCs). For example, some of the plurality of blocks BLK1 through BLKz may be single level cell blocks, while the other blocks may be multilevel cell blocks, triple level cell blocks, or quad level cell blocks.

The peripheral circuit 100 may receive an address ADDR, a command CMD, and a control signal CTRL from the outside of the memory device 10, and may transmit and receive data DATA to/from a device outside the memory device 10. The peripheral circuit 100 may include a control logic 110, the row decoder 120, the page buffer 130, and a substrate control circuit (sub control circuit) 140. Although not shown, the peripheral circuit 100 may further include various sub-circuits such as a voltage generation circuit to generate various voltages necessary for an operation of the memory device 10, and an error correction circuit to correct errors of data read from the memory cell array 50.

The control logic 110 may control an overall operation of the memory device 10, and for example, may control the memory device 10 to perform a memory operation corresponding to the command CMD provided from a memory controller (not shown). The control logic 110 may generate various internal control signals used in the memory device 10 in response to the control signal CTRL provided from the memory controller (not shown).

For example, the control logic 110 may control a voltage level provided to the word lines WL and the bit lines BL when performing the memory operation such as a program operation and/or an erase operation. In addition, the control logic 110 may output a bias control signal CTRL_BIAS to the substrate control circuit 140 when performing the memory operation such as the program operation and/or the erase operation. The control logic 110 may control a bias voltage V_BIAS applied to an upper substrate supporting the memory cell array 50, by outputting the bias control signal CTRL_BIAS.

The row decoder 120 may select at least one of the plurality of blocks BLK1 through BLKz in response to the address ADDR provided from the memory controller (not shown). The row decoder 120 may select at least one of the word lines WL of the selected memory block in response to the address ADDR.

The row decoder 120 may transmit a voltage for performing the memory operation to the word lines WL of the selected memory block. For example, when performing the program operation, the row decoder 120 may transmit a program voltage and a verify voltage to the selected word line WL, and a pass voltage to an unselected word line WL. In addition, the row decoder 120 may select some string selection lines SSL among the string selection lines SSL in response to the address ADDR.

The page buffer 130 may be connected to the memory cell array 50 through the bit lines BL. The page buffer 130 may operate as a write driver and/or a sense amplifier. When performing the program operation, the page buffer 130 may operate as the write driver to apply to the bit lines BL a voltage according to data DATA to be stored in the memory cell array 50. However, when performing the read operation, the page buffer 130 may operate as the sense amplifier to sense data DATA stored in the memory cell array 50.

The substrate control circuit 140 may output the bias voltage V_BIAS based on the bias control signal CTRL_BIAS output from the control logic 110. The bias voltage V_BIAS may be applied, for example, to the upper substrate supporting the memory cell array 50. In this embodiment, the substrate control circuit 140 is described as being separate from the control logic 110, but the substrate control circuit 140 may be configured as a part of the control logic 110.

Figure 2:
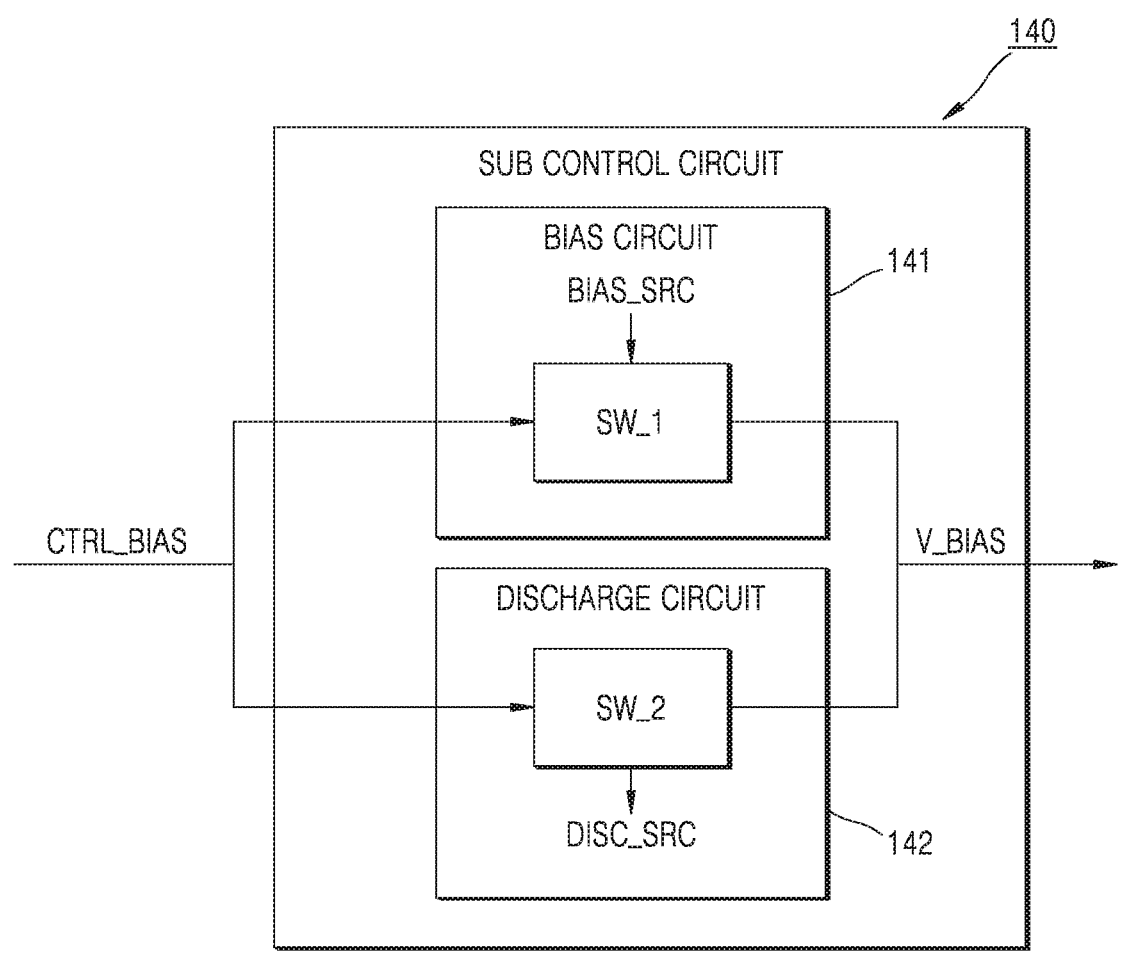
FIG. 2 is a block diagram illustrating a substrate control circuit according to an example embodiment of inventive concepts.

FIG. 2 is a block diagram illustrating the substrate control circuit 140 according to an example embodiment. The substrate control circuit 140 illustrated in FIG. 2 may be or may include, for example, the substrate control circuit 140 illustrated in FIG. 1.

Referring to FIG. 2, the substrate control circuit 140 may include a bias circuit 141 and a discharge circuit 142. The bias circuit 141 may include a first switch SW_1 that is turned on/off based on the bias control signal CTRL_BIAS. For example, when the first switch SW_1 is turned on, a bias power source BIAS_SRC may be output as the bias voltage V_BIAS. The first switch SW_1 may be implemented with one or more transistors. For example, the first switch SW_1 may be implemented with a metal-oxide-semiconductor field effect transistor (MOSFET) in which the bias switch control signal CTRL_BIAS is applied to a gate, and the bias power source BIAS_SRC and the bias voltage V_BIAS are applied to a drain and a source, respectively.

The discharge circuit 142 may include a second switch SW_2 that is turned on/off based on the bias control signal CTRL_BIAS. The second switch SW_2 may operate complementarily with the first switch SW_1, with respect to the bias control signal CTRL_BIAS.

For example, when the first switch SW_2 is turned on, a discharge power source DISC_SRC may be output as the bias voltage V_BIAS. The second switch SW_2 may be implemented with one or more transistors. For example, the second switch SW_2 may be implemented with a MOSFET in which the bias control signal CTRL_BIAS is applied to the gate, and the discharge power source DISC_SRC and the bias voltage V_BIAS are applied to the drain and the source, respectively.

The bias power source BIAS_SRC may have a voltage greater than the discharge power source DISC_SRC. For example, when an erase operation of the memory cell array 50 is performed, the bias power source BIAS_SRC may have a high voltage applied to the upper substrate supporting the memory cell array 50. In addition, the discharge power source DISC_SRC may have a ground voltage. However, the embodiment is not limited thereto, and the discharge power source DISC_SRC may have a voltage of various levels discharging a voltage of the upper substrate supporting the memory cell array 50.

Figure 3:
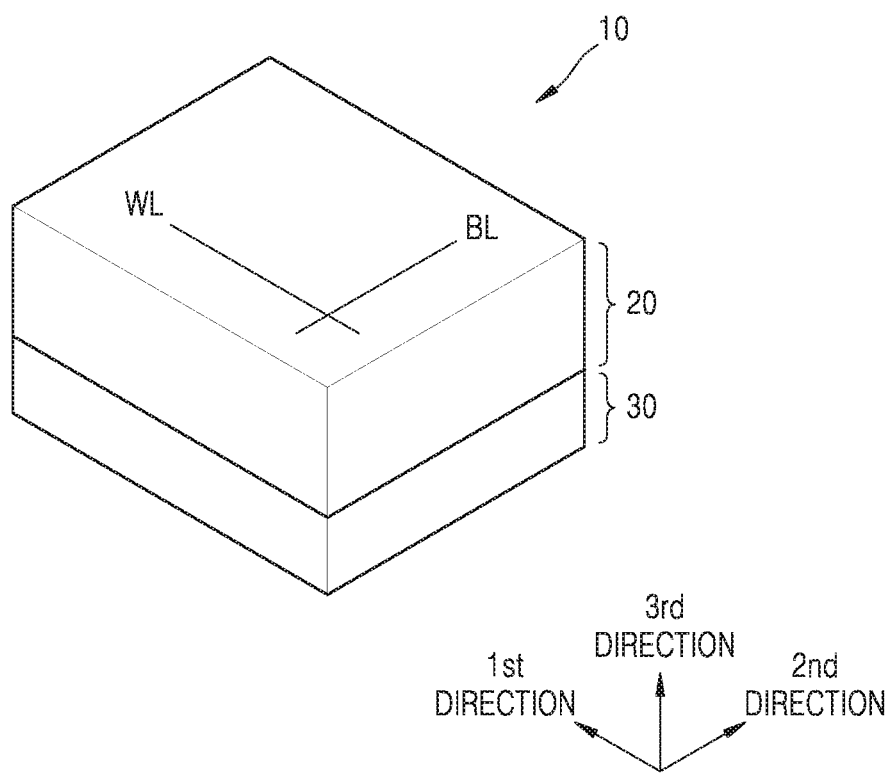
FIG. 3 schematically illustrates a structure of a memory device of FIG. 1 according to an example embodiment of inventive concepts.

FIG. 3 schematically illustrates a structure of the memory device 10 of FIG. 1 according to an embodiment. As described above with reference to FIG. 1, the memory device 10 may include the memory cell array 50 and the peripheral circuit 100, and these components of the memory device 10 may be formed by a semiconductor fabrication process. Hereinafter, FIG. 3 will be described with reference to FIG. 1.

Referring to FIG. 3, the memory device 10 may include a first semiconductor layer 20 extending in a first and second direction, and a second semiconductor layer 30 extending in the first and second direction. The first semiconductor layer 20 may be stacked on the second semiconductor layer 30 in a third direction. According to an example embodiment, the memory cell array 50 in FIG. 1 may be formed in the first semiconductor layer 20 and the peripheral circuit 100 including the substrate control circuit 140 may be formed in the second semiconductor layer 30. For example, the second semiconductor layer 30 may include a lower substrate, and circuits such as the control logic 110, the row decoder 120, and the page buffer 130, and circuits corresponding to the substrate control circuit 140 may be formed by forming a pattern for wiring semiconductor elements such as a transistor and/or other elements on the lower substrate.

In the example embodiment, the second semiconductor layer 30 may be divided into first through fourth regions having the same area, and the substrate control circuit 140 may be arranged so as to overlap the first through fourth regions in the third direction. In addition, a substrate contact plug to electrically connect the lower substrate to the upper substrate may be formed in the second semiconductor layer 30.

After circuits are formed in the second semiconductor layer 30, the first semiconductor layer 20 including the memory cell array 50 may be formed. For example, the first semiconductor layer 20 may include the upper substrate, and the memory cell array 50 may be formed in the first semiconductor layer 20 by forming a plurality of gate conductive layers stacked on the upper substrate and a plurality of channel layers which penetrate the plurality of gate conductive layers and extend in a direction perpendicular to a top surface of the upper substrate (for example, the third direction). In addition, patterns may be formed to electrically connect the memory cell array 50 (that is, the word lines WL and the bit lines BL) to the circuits formed in the second semiconductor layer 30.

Accordingly, the memory device 10 may have a structure in which the memory cell array 50 and the peripheral circuit 100 are in a stacking direction (for example, the third direction), that is, a cell-on-Peri or cell-over-Peri (COP) structure. The COP structure may effectively reduce an area occupied by a surface perpendicular to the stacking direction, and accordingly, the number of memory cells to be integrated in the memory device 10 may be increased, by arranging circuits except for the memory cell array 50 below the memory cell array 50.

Although not shown in FIG. 3, a plurality of pads may be arranged for an electrical connection to the outside of the memory device 10. For example, a plurality of pads may be arranged for the command CMD, the address ADDR, and the control signal CTRL that are received from a device outside the memory device 10, and a plurality of pads may be arranged for inputting/outputting data DATA. The pads may be adjacent to the peripheral circuit 100 which processes signals received from the outside of the memory device 10 or signals transmitted to the outside of the memory device 10, in a vertical direction (the third direction) or in a horizontal direction (a first direction or a second direction).

Figure 4:
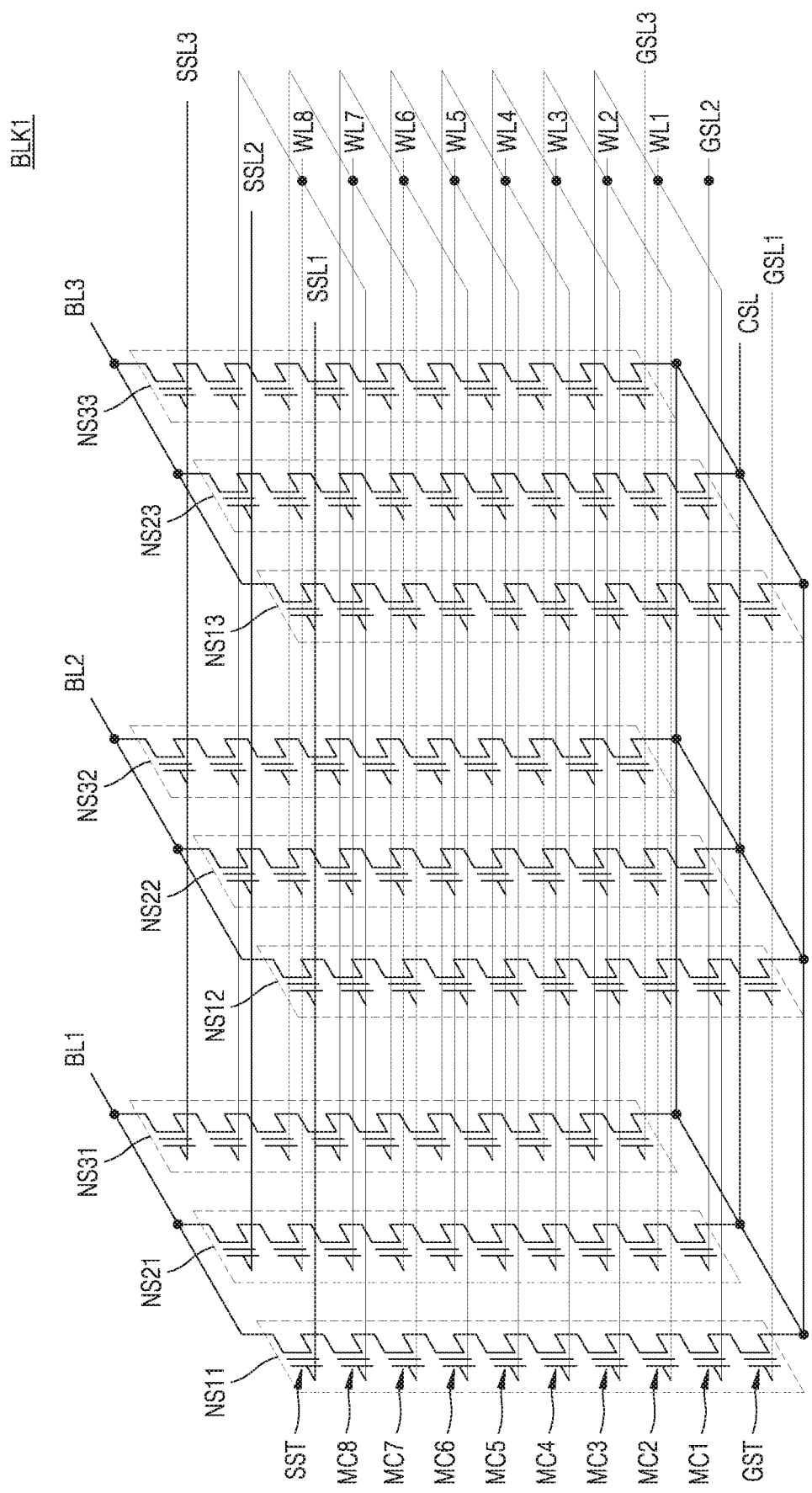
FIG. 4 is a circuit diagram illustrating an equivalent circuit of a memory block BLK1 among memory blocks BLK1 through BLKz in FIG. 1 according to an example embodiment of inventive concepts.

FIG. 4 is a circuit diagram illustrating an equivalent circuit of the first memory block BLK1 among the memory blocks BLK1 through BLKz in FIG. 1 according to an example embodiment.

Referring to FIG. 4, the first memory block BLK1 may be or may include a vertical NAND flash memory, and each of the memory blocks BLK1 through BLKz illustrated in FIG. 1 may be implemented as illustrated in FIG. 4. The first memory block BLK1 may include a plurality of NAND strings NS112 through NS33, a plurality of word lines WL1 through WL8, a plurality of bit lines BL1 through BL3, a plurality of ground selection lines GSL1 through GSL3, a plurality of string selection lines SSL1 through SSL3, and a common source line CSL. Here, the number of NAND strings, the number of word lines WL, the number of bit lines BL, the number of ground selection lines GSL, and the number of string selection lines SSL may be variously changed according to an embodiment.

The NAND strings NS11, NS21, and NS31 may be between the first bit line BL1 and the common source line CSL, the NAND strings NS12, NS22, and NS32 may be between the second bit line BL2 and the common source line CSL, and the NAND strings NS13, NS23, and NS33 may be between the third bit line BL3 and the common source line CSL. Each NAND string (for example, NS11) may include a string selection transistor SST, a plurality of memory cells MC1 through MC8, and a ground selection transistor GST, which are connected to each other in series.

The NAND strings connected in common to one bit line may be included in one column. For example, the NAND strings NS11, NS21, and NS31 commonly connected to the first bit line BL1 may correspond to a first column, the NAND strings NS12, NS22, and NS32 commonly connected to the second bit line BL2 may correspond to a second column, and the NAND strings NS13, NS23, and NS33 connected in common to the third bit line BL3 may correspond to the third column.

The NAND strings connected in common to one string selection line SSL may be included in one row. For example, the NAND strings NS11, NS12, and NS13 connected to the first string selection line SSL1 may correspond to a first row, the NAND strings NS21, NS22, and NS23 connected to the second string selection line SSL2 may correspond to a second row, and the NAND strings NS31, NS32, and NS33 connected to the third string selection line SSL3 may correspond to a third row.

The string selection transistor SST may be connected to each of corresponding string selection lines SSL1 through SSL3. The plurality of memory cells MC1 through MC8 may be connected to corresponding word lines WL1 through WL8, respectively. The ground selection transistor GST may be connected to the corresponding ground selection lines GSL1 through GSL3 and the string selection transistor SST may be connected to the corresponding bit lines BL1 through BL3. The ground selection transistor GST may be connected to the common source line CSL.

In this embodiment, the word lines WL of the same height (for example, WL1) may be connected in common, the string selection lines SSL1 through SSL3 may be separate from each other, and the ground selection lines GSL1 through GSL3 may also be separate from each other. For example, when programming the memory cells connected to the first word line WL1 and included in the NAND strings NS11, NS12, and NS13 corresponding to the first column, the first word line WL1 and the first string selection line SSL1 may be selected. However, the inventive concepts are not limited thereto, and in other embodiments, the ground selection lines GSL1 through GSL3 may be connected in common.

FIG. 5 is a plan view illustrating a top surface of the second semiconductor layer 30 in contact with the first semiconductor layer 20 according to an example embodiment. FIG. 5 is a plan view illustrating, for example, the top surface of the second semiconductor layer 30 illustrated in FIG. 3.

Referring to FIG. 5, the second semiconductor layer 30 may include first through fourth regions R1 through R4 that are defined by a first imaginary line L1 in the first direction and a second imaginary line L2 in the second direction. Each of the first through fourth regions R1 through R4 may overlap, for example, at least a portion of the memory cell array 50 included in the first semiconductor layer 20 in the third direction. In an example embodiment, the first through fourth regions R1 through R4 may have the same area.

The second semiconductor layer 30 may include the substrate control circuit 140. The substrate control circuit 140 may be or may include a circuit that is formed on the lower substrate included in the second semiconductor layer 30 and that outputs a bias voltage to the upper substrate included in the first semiconductor layer 20.

The substrate control circuit 140 may overlap at least two regions of the first through fourth regions R1 through R4 in the third direction. In the example embodiment, the substrate control circuit 140 may overlap each of the first through fourth regions R1 through R4 in the third direction. In other words, at least a portion of the substrate control circuit 140 may overlap the first region R1 in the third direction, and at least a portion of the substrate control circuit 140 may overlap the second region R2 in the third direction. In addition, at least a portion of the substrate control circuit 140 may overlap the third region R3 in the third direction, and at least a portion of the substrate control circuit 140 may overlap the fourth region R4 in the third direction.

A region where the substrate control circuit 140 overlaps the first region R1 may be referred to as a first overlap region A1, a region where the substrate control circuit 140 overlaps the second region R2 may be referred to as a second overlap region A2, a region where the substrate control circuit 140 overlaps the third region R3 may be referred to as a third overlap region A3, and a region where the substrate control circuit 140 overlaps the fourth region R4 may be referred to as a fourth overlap region A4. In the example embodiment, the first through fourth overlap regions A1 through A4 may have substantially the same area. In other words, the substrate control circuit 140 may be arranged at the center of a region where the second semiconductor layer 30 overlaps the memory cell array 50 included in the first semiconductor layer 20. However, the embodiment is not limited thereto, and the first through fourth overlap regions A1 through A4 may have areas of various ratios.

In another example embodiment, the substrate control circuit 140 may overlap two or three regions of the first through fourth regions R1 through R4 in the third direction. In one example, the substrate control circuit 140 may overlap two regions of the first to fourth regions R1 through R4 in the third direction, and may be arranged adjacent to an origin where the first imaginary line L1 overlaps the second imaginary line L2.

Figure 6A:
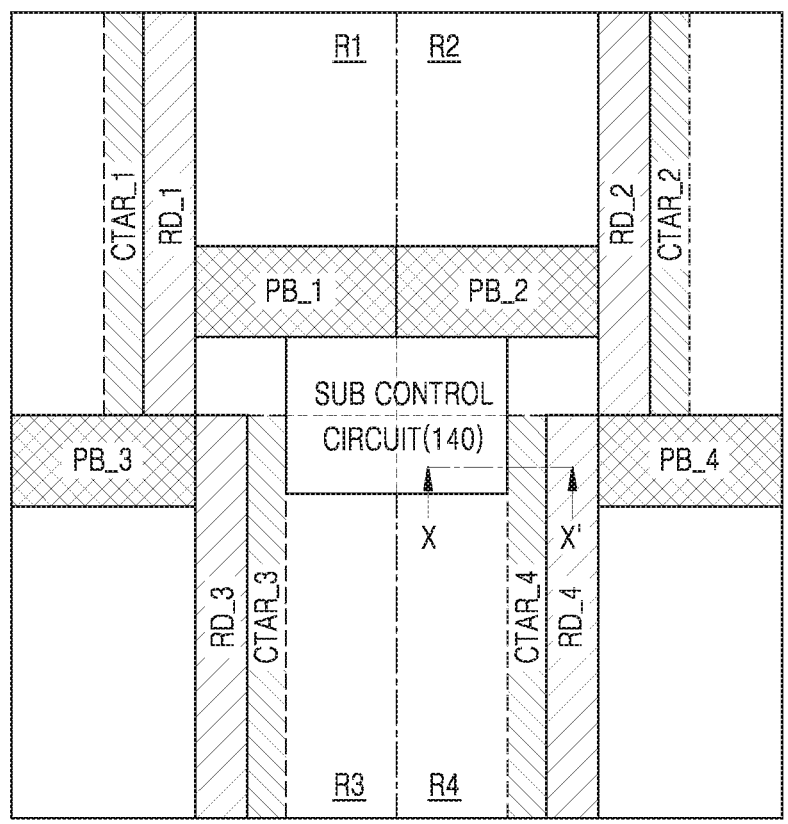
FIG. 6A is a plan view illustrating in detail the top surface of the second semiconductor layer in contact with the first semiconductor layer according to an example embodiment of inventive concepts.
Figure 6B:
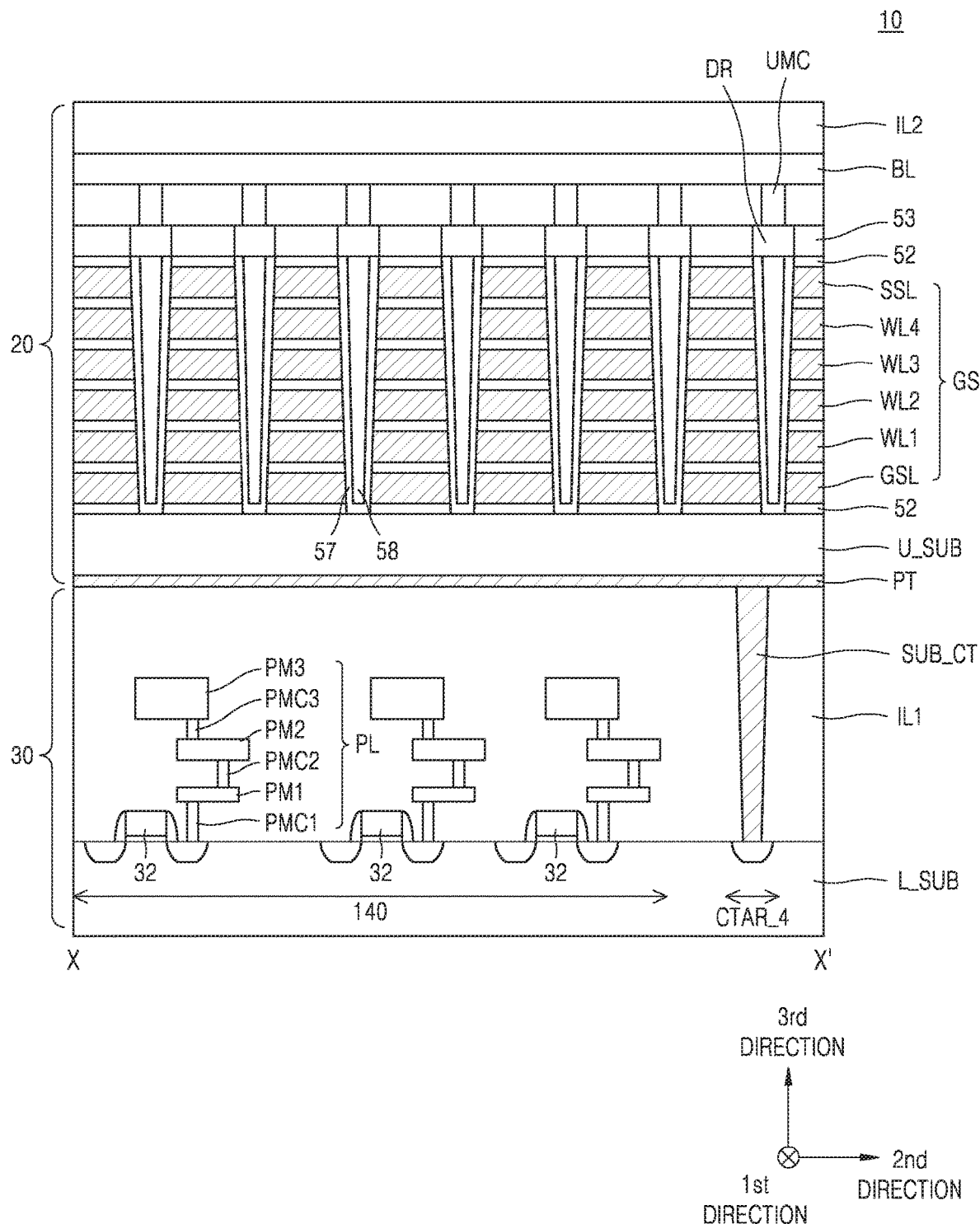
FIG. 6B is a cross-sectional view of the memory device illustrating respective configurations of the first semiconductor layer and the second semiconductor layer, taken along a line X-X' in FIG. 6A.

FIG. 6A is a plan view illustrating in detail the top surface of the second semiconductor layer 30 in contact with the first semiconductor layer 20 according to an example embodiment of inventive concepts. FIG. 6B is a cross-sectional view of the memory device illustrating respective configurations of the first semiconductor layer 20 and the second semiconductor layer 30, taken along a line X-X' in FIG. 6A. FIGS. 6A and 6B may be a top view and a cross-sectional view of, for example, the memory device 10 illustrated in FIG. 3, respectively.

Referring to FIG. 6A, the row decoder 120 may be divided into first through fourth row decoders RD_1 through RD_4 and be arranged in the second semiconductor layer 30, and the page buffer 130 may be divided into first through fourth page buffers PB_1 trough PB_4 and be arranged in the second semiconductor layer 30. In an example embodiment, the first page buffer PB_1 and the first row decoder RD_1 may be arranged in the first region R1, the second page buffer PB_2 and the second row decoder RD_2 may be arranged in the second region R1, the third page buffer PB_3 and the third row decoder RD_3 may be arranged in the third region R3, and the fourth page buffer PB_4 and the fourth row decoder RD_4 may be arranged in the fourth region R4.

For example, a portion of the memory cell array 50, overlapping the first and third regions R1 and R3, and a portion of the memory cell array 50, overlapping the second and fourth regions R2 and R4, may respectively form different sub-arrays from each other. Each of the different sub-arrays may perform a separate memory operation. As illustrated in FIG. 6A, the first and third page buffers PB_1 and PB_3 and the first and third row decoders RD_1 and RD_3 may be arranged as a windmill so as to overlap one sub-array. Likewise, the second and fourth page buffers PB_2 and PB_4 and the second and fourth row decoders RD_2 and RD_4 may also be arranged as the windmill so as to overlap the other sub-array.

The second semiconductor layer 30 may have first through fourth connection regions CTAR_1 through CTAR_4 to connect the substrate control circuit 140 to the upper substrate included in the first semiconductor layer 20. Each of the first through fourth connection regions CTAR_1 through CTAR_4 may include at least one substrate contact plug electrically connecting the lower substrate to the upper substrate.

In an example embodiment, the first through fourth connection regions CTAR_1 through CTAR_4 may be arranged in the first through fourth regions R1 through R4, respectively. In other words, the first connection region CTAR_1 may be formed in the first region R1 in the first direction, the second connection region CTAR_2 may be formed in the second region R2 in the first direction, the third connection region CTAR_3 may be formed in the third region R3 in the first direction, and the fourth connection region CTAR_4 may be formed in the fourth region R4 in the first direction.

In an example embodiment, the first and second connection regions CTAR_1 and CTAR_2 may be symmetrically arranged about a boundary between the first and second regions R1 and R2. The third and fourth connection regions CTAR_3 and CTAR_4 may be arranged symmetrically about a boundary between the third and fourth regions R3 and R4. The boundary between the first and second regions R1 and R2, and the boundary between the third and fourth regions R3 and R4 may be or may include, for example, the first imaginary line L1.

Referring to FIG. 6B, the memory device 10 may include the second semiconductor layer 30 including the substrate control circuit 140 and the first semiconductor layer 20 including gate conductive layers GS and a channel layer 57. The memory device 10 may have a structure in which the first semiconductor layer 20 is stacked on the second semiconductor layer 30. The gate conductive layers GS and the channel layer 57 may form the memory cell array 50.

The second semiconductor layer 30 may include a lower substrate L_SUB, at least one peripheral transistor 32 on the lower substrate L_SUB, peripheral circuit lines PL electrically connected to the peripheral transistors 32, and a lower insulating layer IL1 covering the peripheral transistors 32 and the peripheral circuit lines PL. For example, the lower substrate L_SUB may be or may include a semiconductor substrate including a semiconductor material such as monocrystalline silicon or monocrystalline germanium, and may be fabricated from a silicon wafer.

The substrate control circuit 140 may be formed in some area of the lower substrate L_SUB. In other words, one or more peripheral transistors 32 may be formed on the lower substrate L_SUB to constitute the substrate control circuit 140.

The peripheral circuit lines PL may include a first peripheral conductive line PM1, a second peripheral conductive line PM2, and a third peripheral conductive line PM3 that are sequentially stacked on the lower substrate L_SUB. In addition, the peripheral circuit lines PL may further include a first peripheral contact PMC1 electrically connecting the peripheral transistor 32 to the first peripheral conductive line PM1, a second peripheral contact PMC2 electrically connecting the first peripheral conductive line PM1 to the second peripheral line PM2, and a third peripheral contact PMC3 electrically connecting the second peripheral conductive line PM2 to the third peripheral conductive line PM3.

The second semiconductor layer 30 may include a connection region (for example, the fourth connection region CTAR_4) where the substrate contact plug SUB_CT penetrating the lower insulating layer IL1 in the third direction is formed. The substrate contact plug SUB_CT may electrically connect the lower substrate L_SUB to the upper substrate U_SUB. In an example embodiment, the substrate control circuit 140 may provide the bias voltage V_BIAS to the upper substrate U_SUB through the substrate contact plug SUB_CT.

In one example, the substrate contact plug SUB_CT may include polysilicon doped with a first conductivity type (for example, p-type) impurity. In another example, the substrate contact plug SUB_CT may include at least one of a metal (for example, tungsten, copper, or aluminum), a conductive metal nitride (for example, titanium nitride or tantalum nitride), a transition metal (for example, titanium or tantalum), and metal silicide.

The first semiconductor layer 20 may include the upper substrate U_SUB, the gate conductive layers GS on the upper substrate U_SUB, the channel layers 57 penetrating the gate conductive layers GS and extending in the third direction to a top surface of the upper substrate U_SUB, an upper contact UMC, and the bit line BL. In addition, the first semiconductor layer 20 may include an upper insulating layer IL2 covering the gate conductive layers GS, the upper contact UMC, and the bit line BL. For example, the gate conductive layers GS and the channel layers 57 may form the memory cell array 50.

The upper substrate U_SUB may be between the gate conductive layers GS and the second semiconductor layer 30. The upper substrate U_SUB may be or may include a supporting layer to support the gate conductive layers GS. The upper substrate U_SUB may be referred to as, for example, a base substrate.

The upper substrate U_SUB may be or may include a polysilicon film doped with the first conductivity type (for example, p-type). The upper substrate U_SUB may be or may include a bulk silicon substrate, a silicon on insulator (SOI) substrate, a germanium substrate, a germanium on insulator (GOI) substrate, a silicon germanium substrate, or an epitaxial thin film obtained by performing a selective epitaxial growth (SEG) operation. The upper substrate U_SUB may include a semiconductor material, and may include at least one of silicon (Si), germanium (Ge), silicon germanium (SiGe), gallium arsenide (GaAs), indium gallium arsenide (InGaAs), and aluminum gallium arsenide (AlGaAs), or a combination thereof.

The gate conductive layers GS may include the ground selection line GSL, the word lines WL1 through WL4, and the string selection line SSL. The ground selection line GSL, the word lines WL1 through WL4, the string selection line SSL may be sequentially formed on the upper substrate U_SUB, and an insulating layer 52 may be arranged on top surfaces and bottom surfaces of the gate conductive layers GS, respectively. In example embodiments, four word lines WL are illustrated as being formed in a simplified manner. However, a plurality of word lines WL may be vertically stacked on the upper substrate U_SUB between the ground selection line GSL and the string selection line SSL, and a structure may be formed in which the insulating layers 52 are between adjacent word lines WL. In addition, a structure may also be formed in which two or more of the ground selection lines GSL and two or more of the string selection lines SSLs are stacked in the vertical direction.

The channel layer 57 may penetrate the gate conductive layers GS and the insulating layers 52 and extend in a third direction perpendicular to the top surface of the upper substrate U_SUB, and a bottom surface of the channel layer 57 may contact the top surface of the upper substrate U_SUB. For example, the channel layer 57 may include polysilicon doped with impurities, or alternatively may include polysilicon that is not doped with impurities. The channel layer 57 may be formed in a vertically extending cup shape (or a bottom-blocked cylinder shape), and a buried insulating film 58 may be arranged on an inner wall of the channel layer 57. The buried insulating film 58 may include an insulating material such as silicon oxide and/or an air gap. As another example, the channel layer 57 may be formed in a pillar shape, and in this case, the buried insulating film 58 may not be formed.

For example, the ground selection lines GSL and a portion of the channel layer 57 adjacent to the ground selection lines GSL may be included in the ground selection transistor (GST in FIG. 4). In addition, the word lines WL1 through WL4 and a portion of the channel layer 57 adjacent to the word lines WL1 through WL4 may constitute the memory cell transistors (MC1 through MC8 in FIG. 4). In addition, the string selection lines SSL and a portion of the channel layer 57 adjacent to the string selection lines SSL may constitute the string selection transistor (SST in FIG. 4).

A drain region DR may be formed on the channel layer 57 and the buried insulating film 58. For example, the drain region DR may include polysilicon doped with impurities. The drain region DR may be referred to as a channel pad. The drain region DR may be electrically connected to the bit line BL through the upper contact UMC.

An etch stop layer 53 may be formed on a sidewall of the drain region DR. A top surface of the etch stop layer 53 may be formed on the same level as the top surface of the drain region DR. The etch stop layer 53 may include an insulating material such as silicon nitride and silicon oxynitride.

The first semiconductor layer 20 may further include a plate electrode PT under the upper substrate U_SUB. The plate electrode PT may be between the upper substrate U_SUB and the second semiconductor layer 30.

The plate electrode PT may be electrically connected to the upper substrate U_SUB and the substrate contact plug SUB_CT. A top surface of the plate electrode PT may contact the upper substrate U_SUB. In addition, a bottom surface of the plate electrode PT may contact the top surface of the substrate contact plug SUB_CT. An area of the plate electrode PT may be substantially the same as that of the upper substrate U_SUB, but inventive concepts are not limited thereto.

In one example, the plate electrode PT may include polysilicon doped with the first conductivity type (for example, p-type) impurity. In an example embodiment, the upper substrate U_SUB, the plate electrode PT, and the substrate contact plug SUB_CT may include polysilicon doped with the same conductivity type. For example, doping concentration of the plate electrode PT and/or the substrate contact plug SUB_CT may be higher than that of the upper substrate U_SUB so as to reduce Ohmic resistance between the plate electrode PT and the upper substrate U_SUB. In another example, the plate electrode PT may include at least one of a metal (for example, tungsten, copper or aluminum), a conductive metal nitride (for example, titanium nitride or tantalum nitride), a transition metal (for example, titanium or tantalum), and metal silicide.

A substrate control circuit formed on a lower substrate may be electrically connected to an upper substrate through a substrate contact plug included in a second semiconductor layer so that the substrate control circuit is freely arranged under a memory cell array and thus, a degree of integration of a memory device is improved. In addition, the substrate control circuit may be arranged to overlap first through fourth regions divided so as to have the same area in the second semiconductor layer so that resistance in applying a bias voltage to the upper substrate is reduced and difference in voltage level depending on a position in the upper substrate is improved. Thus, reliability of operation of the memory device may be improved.

Figure 7:
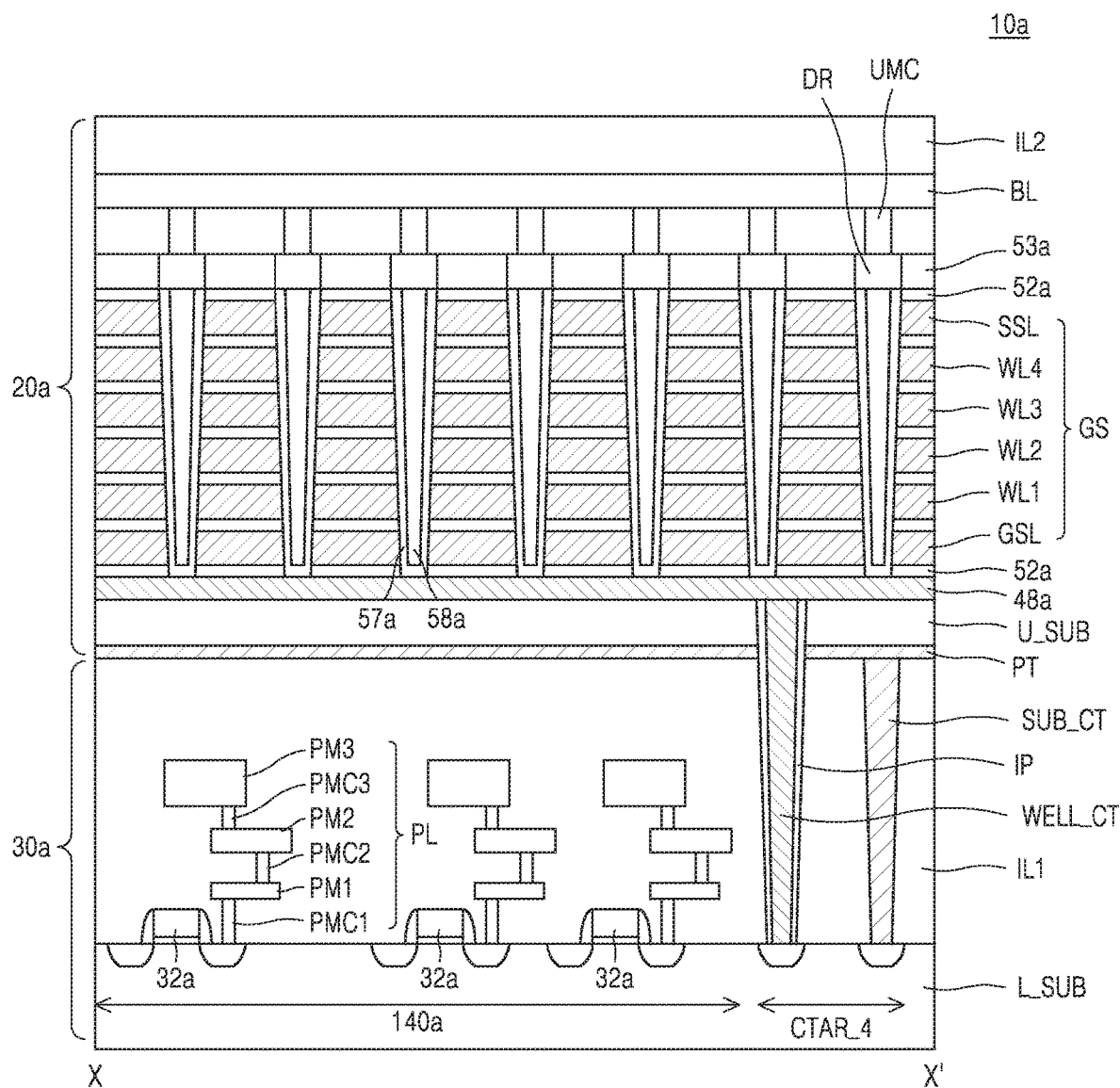
FIG. 7 is a cross-sectional view of a memory device according to another embodiment, illustrating respective configurations of the first and second semiconductor layers taken along the line X-X' in FIG. 6A.

FIG. 7 is a cross-sectional view of a memory device 10*a* according to another embodiment, illustrating respective configurations of first and second semiconductor layers 20*a* and 30*a* taken along the line X-X' in FIG. 6A. In the configuration illustrated in FIG. 7, descriptions already given with reference to FIG. 6B are omitted.

Referring to FIG. 7, a well region 48*a* may be formed in the upper substrate U_SUB. The well region 48*a* may be or may include an n-type well doped with a second conductivity type (for example, n-type) impurity on the upper substrate U_SUB. However, example embodiments are not limited thereto, and the well region 48*a* may be or may include a p-type well doped with the first conductivity type impurity. In addition, the well region 48*a* may be formed by overlapping a first conductive well and a second conductive well.

The well region 48*a* is electrically connected to a portion of the lower substrate L_SUB through an insulating layer pattern IP penetrating the upper substrate U_SUB, the plate electrode PT, and the lower insulating layer IL1, and a well contact plug WELL_CT. In an example embodiment, a common source voltage control circuit (not shown) may be formed on the lower substrate L_SUB, and the well region 48*a* may be provided with a voltage to be applied to the common source line from the common source voltage control circuit (not shown) through the well contact plug WELL_CT.

Figure 8:
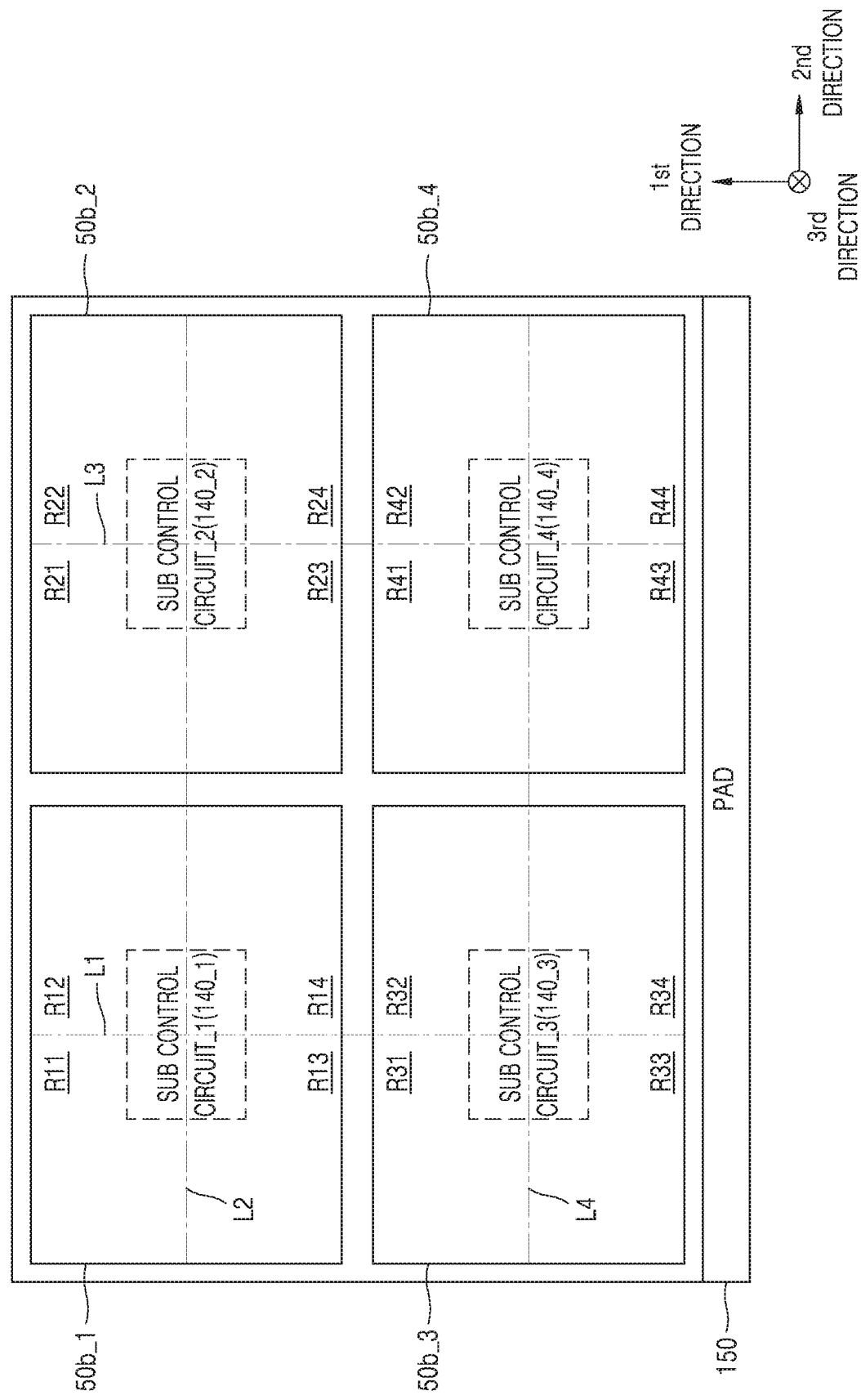
FIG. 8 is a layout diagram illustrating a memory device according to an example embodiment.

FIG. 8 is a layout diagram of a memory device 10*b* according to an example embodiment. The layout of FIG. 8 may be a layout of a semiconductor chip including a plurality of memory cell arrays.

Referring to FIG. 8, the memory device 10*b* may include a first through fourth memory cell arrays 50*b*_1 through 50*b*_4 and a first through fourth substrate control circuits 140_1 through 140_4, in the first direction and the second direction. The memory device 10*b* may further include a pad region (PAD) 150 in which a plurality of pads electrically connected to the outside of the memory device 10*b* are arranged.

The first through fourth substrate control circuits 140_1 through 140_4 may be arranged under the first through fourth memory cell arrays 50*b*_1 through 50*b*_4, respectively. In other words, the first through fourth memory cell arrays 50*b*_1 through 50*b*_4 may be formed in a first semiconductor layer (for example, 20 in FIG. 3), and the first through fourth substrate control circuits 140_1 through 140_4 may be formed in a second semiconductor layer (for example, 30 in FIG. 3) stacked in a third direction under the first semiconductor layer (for example, 20 in FIG. 3). This type of a structure may be referred to as the COP structure, and the COP structure has been described with reference to FIG. 3.

A region overlapping each of the first through fourth memory cell arrays 50*b*_1 through 50*b*_4 in the third direction in the memory device 10*b* may be divided into a plurality of regions by two of the imaginary lines L1 through L4. For example, a region overlapping the first memory cell array 50*b*_1 in the third direction in the memory device 10*b* may be divided into first through fourth regions R11, R12, R13, and R14 by the first and second imaginary lines L1 and L2. In an example embodiment, the first through fourth regions R11, R12, R13, and R14 may have the same area. In an example embodiment, the substrate control circuit 140_1 may overlap the first through fourth regions R11, R12, R13, and R14 in the third direction.

The second through fourth memory cell arrays 50*b*_2 through 50*b*_4 and the second through fourth substrate control circuits 140_2 through 140_4 may be arranged in the same or similar arrangement as the first memory cell array 50*b*_1 and the first substrate control circuit 140_1, respectively. A duplicate description thereof will be omitted.

Figure 9:
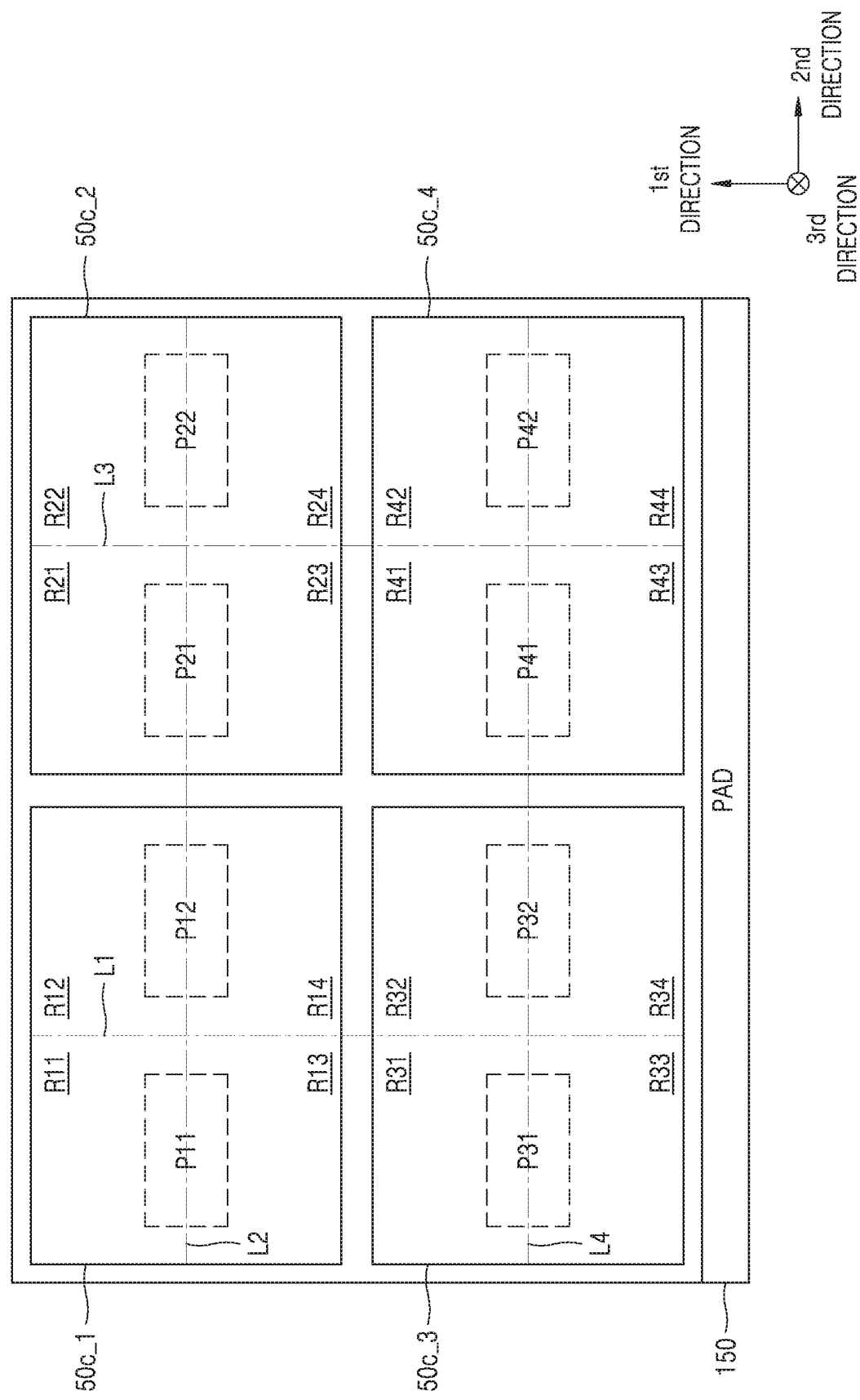
FIG. 9 is a layout diagram illustrating a memory device according to another example embodiment.

FIG. 9 is a layout diagram of a memory device 10c according to an example embodiment. In the configuration illustrated in FIG. 9, descriptions already given with reference to FIG. 8 are omitted.

Referring to FIG. 9, the first through fourth substrate control circuits 140c_1 through 140c_4 may be separated into a plurality of partial control circuits, respectively. The first substrate control circuit 140c_1 may be separated into a 1-1 partial control circuit P11 and a 1-2 partial control circuit P12, the second substrate control circuit 140c_2 may be separated into a 2-1 partial control circuit P21 and a 2-2 partial control circuit P22, the third substrate control circuit 140c_3 may be separated into a 3-1 partial control circuit P31 and a 3-2 partial control circuit P32, and the fourth substrate control circuit 140c_4 may be separated into a 4-1 partial control circuit P41 and a 4-2 partial control circuit P42.

In an example embodiment, each partial control circuit may provide a bias voltage to the upper substrate U_SUB supporting a sub-array included in each of the memory cell arrays 50c_1 through 50c_4. For example, when the first memory cell array 50c_1 includes a first and second sub-arrays (not shown), the 1-1 partial control circuit P11 may provide the bias voltage to the upper substrate supporting the first sub-array, and the 1-2 partial control circuit P12 may apply the bias voltage to the upper substrate supporting the second sub-array.

In the example embodiment, the 1-1 partial control circuit P11 may overlap the first and third regions R11 and R13 in the third direction, and the 1-2 partial control circuit P12 may overlap the second and the fourth regions R12 and R14 in the third direction. For example, the 1-1 partial control circuit P11 and the 1-2 partial control circuit P12 may be symmetrically arranged in the second direction with respect to the first imaginary line L1.

The second through fourth memory cell arrays 50c_2 through 50c_4 and the second through fourth substrate control circuits 140c_2 through 140c_4 may have the same or similar configuration and arrangement as the first memory cell array 50c_1 and the first substrate control circuit 140c_1, respectively. A duplicate description thereof will be omitted.

Figure 10:
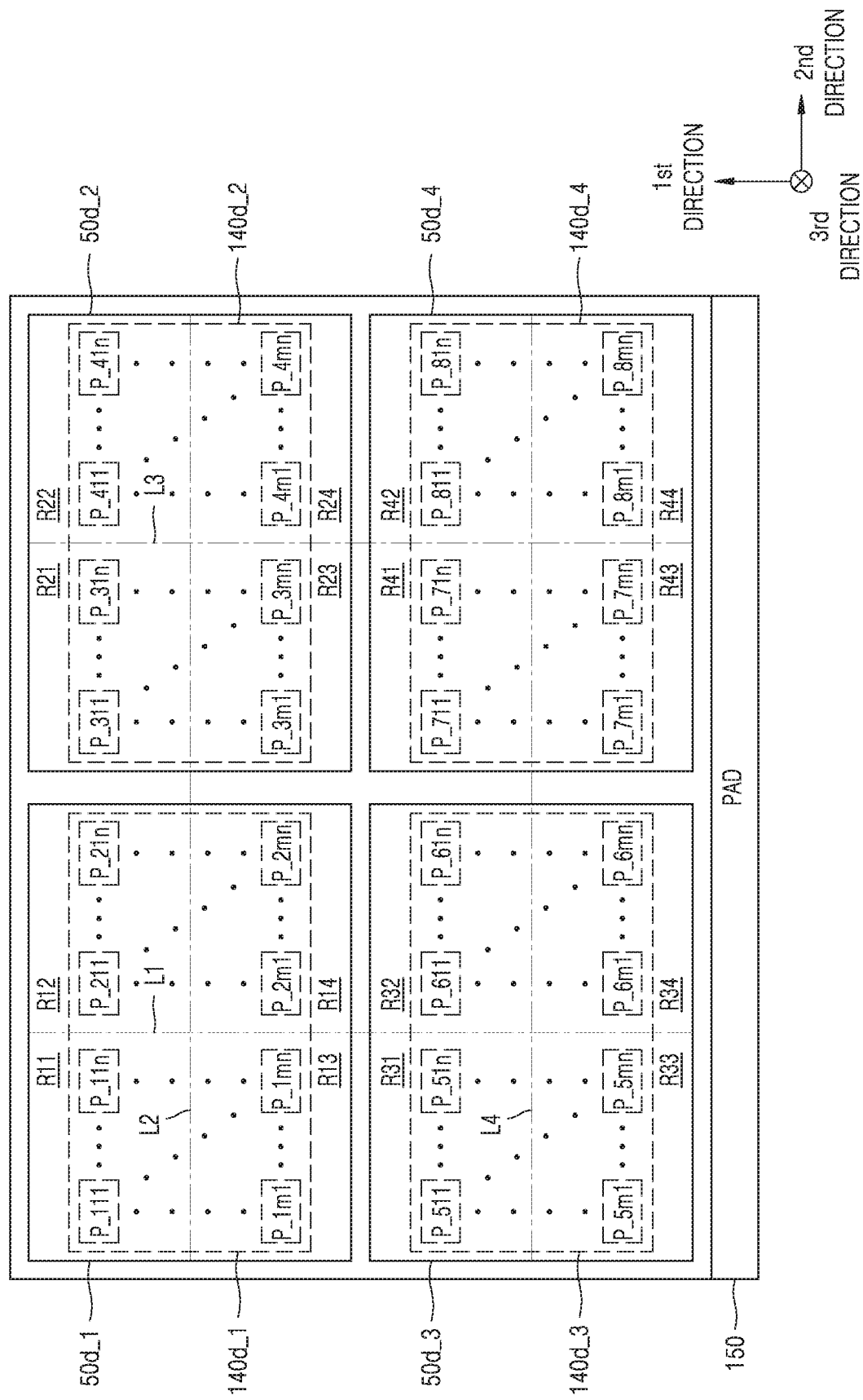
FIG. 10 is a layout diagram illustrating a memory device according to another example embodiment.

FIG. 10 is a layout diagram of a memory device 10d according to an example embodiment. In the configuration illustrated in FIG. 10, descriptions already given with reference to FIG. 8 are omitted.

Referring to FIG. 10, the first through fourth substrate control circuits 140d_1 through 140d_4 may be separated into a plurality of partial control circuits, respectively. The first through fourth substrate control circuits 140d_1 through 140d_4 may respectively include 2×m×n (where m and n are integers equal to or greater than 2) partial control circuits.

In an example embodiment, the first through fourth memory cell arrays 50d_1 through 50d_4 may be divided into a plurality of sub-arrays corresponding to the number of overlapping partial control circuits. For example, when the first substrate control circuit 140d_1 includes 2×m×n partial control circuits, the first memory cell array 50d_1 may be divided into 2×m×n sub-arrays. Each partial control circuit may provide a bias voltage to the upper substrate supporting a corresponding sub-array.

In the example embodiment, partial control circuits P_111 through P_1mn included in the first substrate control circuit 140d_1 may be arranged in the first or third region, and the remaining partial control circuits P_211 through P_2mn may be arranged in the second or fourth region. The partial control circuits P_111 through P_1mn arranged in the first or third region and the partial control circuits P_211 through P_2mn arranged in the second or fourth region may be symmetrically arranged in the second direction with respect to the first imaginary line L1. The second through fourth memory cell arrays 50d_2 through 50d_4 and the second through fourth substrate control circuits 140d_2 through 140d_4 may have the same or similar configuration and arrangement as the first memory cell array 50d_1 and the first substrate control circuit 140d_1, respectively. A duplicate description thereof will be omitted.

Figure 11:
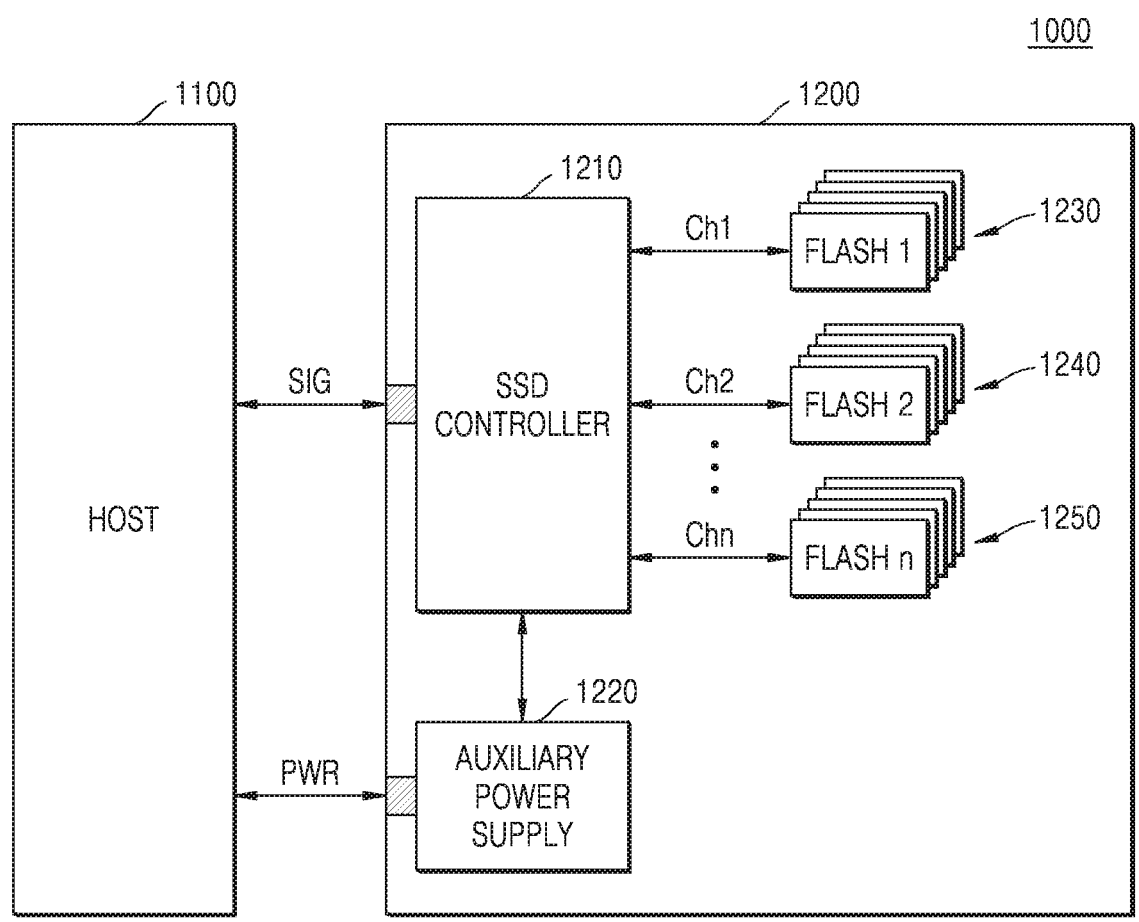
FIG. 11 is a block diagram illustrating a solid state drive (SSD) system 1000 including a memory device according to an example embodiment.

FIG. 11 is a block diagram illustrating a solid state drive (SSD) system 1000 including a memory device according to an example embodiment.

Referring to FIG. 11, the SSD system 1000 may include a host 1100 and the SSD 1200. The SSD 1200 may transmit/receive a signal to/from the host 1100 through a signal connector, and may receive power through a power connector.

The SSD 1200 may include an SSD controller 1210, an auxiliary power supply 1220, and a plurality of memory devices 1230, 1240, and 1250. Each of the plurality of memory devices 1230, 1240, and 1250 may be or may include a vertically stacked NAND flash memory device, and may be implemented according to example embodiments described above with reference to FIGS. 1 through 10. Accordingly, each of the memory devices 1230, 1240, and 1250 may have a high degree of integration as reliability of operation thereof is improved.

As described above, example embodiments have been provided in the drawings and the specification. While example embodiments have been described herein with reference to specific terms, it should be understood that they have been used only for the purpose of describing the technical idea of inventive concepts and not for limiting the scope of inventive concepts as defined in the claims. Therefore, it will be clearly understood by one of ordinary skill in the art that various modifications and equivalent embodiments are possible without departing from the scope of inventive concepts. Accordingly, the true scope of protection of inventive concepts should be determined by the technical idea of the following claims.

What is claimed is:

1. A nonvolatile memory device comprising:
   a first semiconductor layer including,
   an upper substrate including a well region,
   a plate electrode of which a top surface contacts a bottom surface of the upper substrate, and
   a memory cell array in which a plurality of word lines on the upper substrate extend in a first direction and a plurality of bit lines extend in a second direction; and
   a second semiconductor layer under the first semiconductor layer in a third direction perpendicular to the first and second directions, the second semiconductor layer including,
   a lower substrate, and
   a substrate control circuit on the lower substrate and configured to output a bias voltage to the upper substrate,
   wherein the second semiconductor layer is divided into first through fourth regions, each of the first through fourth regions having an identical area, the substrate control circuit overlaps at least a portion of each of the first through fourth regions in the third direction,
   each of the first through fourth regions of the second semiconductor layer comprises at least one respective substrate contact plug, wherein at least one substrate contact plug includes a first substrate contact plug and a second substrate contact plug, wherein the first substrate contact plug connects the well region of the upper substrate and the lower substrate, and the second substrate contact plug connects the plate electrode and the lower substrate, and each of the first substate contact plugs directly connect to the well region of the upper substrate and has a sidewall having a straight and continuous profile, each of the second substrate contact plugs directly connect to the plate electrode and has a sidewall having a straight and continuous profile, and each of the first substrate contact plugs has a height greater than any of the second substrate contact plugs.

2. The nonvolatile memory device of claim 1, wherein the first and second regions are symmetrical about a boundary between the first and second regions.

3. The nonvolatile memory device of claim 1, wherein the plate electrode is formed between the second semiconductor layer and the upper substrate, the second substrate contact plug electrically connects the plate electrode to the substrate control circuit.

4. The nonvolatile memory device of claim 3, wherein the upper substrate, the plate electrode, and the second substrate contact plug each include polysilicon doped with an identical conductivity type.

5. The nonvolatile memory device of claim 4, wherein a doping concentration of the plate electrode and the second substrate contact plug is greater than a doping concentration of the upper substrate.

6. The nonvolatile memory device of claim 3, wherein the plate electrode and the second substrate contact plug comprise a metal material.

7. The nonvolatile memory device of claim 1, wherein at least a first through fourth area of the substrate control circuit respectively overlap the first through fourth regions, wherein the first through fourth area of the substrate control circuit are substantially identical.

8. The nonvolatile memory device of claim 1, wherein the substrate control circuit comprises a first sub-control circuit and a second sub-control circuit, wherein the first sub-control circuit overlaps the first and third regions in the third direction, and the second sub-control overlaps the second and fourth regions in the third direction, and the bias voltage corresponding to a voltage for programming or erasing at least one of the each cell in the memory cell array.

9. The nonvolatile memory device of claim 1, wherein the first and third regions are adjacent to each other in the first direction and the first and second region are adjacent to each other in the second direction.

10. The nonvolatile memory device of claim 1, wherein the memory cell array comprises a plurality of gate conductive layers stacked on the upper substrate, and a plurality of channel layers penetrating the plurality of gate conductive layers and extending in a third direction perpendicular to the first and second directions.

11. The nonvolatile memory device of claim 1, wherein the substrate control circuit is at a center of an overlap region between the second semiconductor layer and the memory cell array.

12. The nonvolatile memory device of claim 1, wherein the substrate control circuit overlaps only one corner of each of the first through fourth regions.

13. A nonvolatile memory device comprising:
a first semiconductor layer including an upper substrate, a plate electrode of which a top surface contacts a bottom surface of the upper substrate, and a memory cell array stacked on the upper substrate in a stacking direction; and
a second semiconductor layer under the first semiconductor layer in the stacking direction, the second semiconductor layer including a lower substrate, a plurality of substrate contact plugs between the lower substrate and the upper substrate, and a substrate control circuit on the lower substrate and configured to provide a bias voltage to the upper substrate through the plurality of substrate contact plugs,
wherein the second semiconductor layer is divided into first through fourth regions having an identical area and, in the stacking direction, the substrate control circuit overlaps at least a portion of at least two regions among the first through fourth regions,
wherein the plurality of substrate contact plugs include a first substrate contact plug and a second substrate contact plug,
wherein the first substrate contact plug connects a well region of the upper substrate and the lower substrate, wherein the second substrate contact plug connects the plate electrode and the lower substrate, and
each of the first substate contact plugs directly connect to the wall region of the upper substrate and has a sidewall having a straight and continuous profile, each of the second substrate contact plugs directly connect to the plate electrode and has a sidewall having a straight and continuous profile, and each of the first substate contact plus has a height greater than any of the second substrate contact plugs.

14. The nonvolatile memory device of claim 13, wherein the upper substrate comprises polysilicon doped with a first conductivity type, and the well region is doped with a second conductivity type opposite to the first conductivity type.

15. The nonvolatile memory device of claim 14,
wherein the first substrate contact plug penetrates a portion of the first semiconductor layer and a portion of the second semiconductor layer, electrically connects the well region to the lower substrate, is surrounded by an insulating pattern filling a hole through the upper substrate, and a configured to supply a voltage to a common source line.

16. The nonvolatile memory device of claim 13,
wherein a bottom surface of the plate electrode contacts a top surface of the second substrate contact plug.

17. A nonvolatile memory device comprising:
a first semiconductor layer including,
a memory cell array in which a plurality of word lines extend in a first direction and a plurality of bit lines extend in a second direction,
an upper substrate under the memory cell array, the upper substrate supporting the memory cell array and including a well region; and
a plate electrode of which a top surface contacts a bottom surface of the upper substrate; and
a second semiconductor layer under the first semiconductor layer in a third direction perpendicular to the first and second directions, the second semiconductor layer including
a lower substrate,
a substrate control circuit on the lower substrate and configured to output a bias voltage to the upper substrate, and a plurality of substrate contact plugs electrically connecting the upper substrate and the lower substrate to output the bias voltage to the upper substrate, wherein the second semiconductor layer is divided by a first imaginary line in the first direction and a second imaginary line in the second direction which cross each other, and the second semiconductor layers comprises at least a portion of first through fourth regions overlapping the memory cell array, wherein the plurality of substrate contact plugs include a first substrate contact plug and a second substrate contact plug, wherein the first substrate contact plug connects the well region of the upper substrate and the lower substrate, wherein the second substrate contact plug connects the plate electrode and the lower substrate, and each of the first substate contact plugs directly connect to the wall region of the upper substrate and has a sidewall having a straight and continuous profile, each of the second substrate contact plugs directly connect to the plate electrode and has a sidewall having a straight and continuous profile, and each of the first substrate contact plugs has a height greater than any of the second substrate contact plugs.

18. The nonvolatile memory device of claim 17, wherein at least a first through fourth area of the substrate control circuit respectively overlap at least a portion of the first through fourth regions in the third direction.

19. The nonvolatile memory device of claim 17, wherein at least one substrate contact plug in the first region and at least one substrate contact plug in the second region are symmetric about a boundary between the first and second regions.

20. The nonvolatile memory device of claim 17, wherein the first through fourth regions have an identical area.

* * * * *